United States Patent
Hsu et al.

(10) Patent No.: US 6,456,521 B1
(45) Date of Patent: Sep. 24, 2002

(54) HIERARCHICAL BITLINE DRAM ARCHITECTURE SYSTEM

(75) Inventors: Louis L. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/814,418

(22) Filed: Mar. 21, 2001

(51) Int. Cl.[7] ............................................. G11C 11/24
(52) U.S. Cl. ................................... 365/149; 365/230.03
(58) Field of Search ......................... 365/149, 230.03, 365/129, 230.01

(56) References Cited

U.S. PATENT DOCUMENTS

| | | | |
|---|---|---|---|
| 5,394,371 A | | 2/1995 | Hotta |
| 5,761,109 A | * | 6/1998 | Takashima et al. ......... 365/149 |
| 5,815,428 A | * | 9/1998 | Tsuruda et al. ............. 365/149 |
| 5,953,277 A | * | 9/1999 | Mukunoki et al. .......... 365/149 |
| 5,991,223 A | * | 11/1999 | Kozaru et al. ......... 365/230.03 |
| 6,094,392 A | * | 7/2000 | Utsugi et al. .......... 365/189.11 |

* cited by examiner

Primary Examiner—Hoai Ho
(74) Attorney, Agent, or Firm—Dilworth & Barrese, LLP

(57) ABSTRACT

A hierarchical bitline DRAM architecture system is disclosed having a DRAM array which includes master and local bitlines for achieving a DRAM chip having low-power consumption, high-density and small size without affecting the chip's performance, including high random access speed and short cycle time. The DRAM array is designed to be noise-free and to prevent data from being lost during read/write operations. The DRAM array includes a folded-bitline differential sensing scheme and high array efficiency. The DRAM array has a minimum amount of sense amplifiers as compared to conventional DRAMs to save chip area and conserve power. The DRAM array is capable of storing data in both the single-cell and twin-cell array format and is interchangeable between single-cell and twin-cell array operation. The hierarchical bitline DRAM architecture system is extended to provide a hierarchical bitline and wordline DRAM architecture system having a DRAM array which includes master and local bitlines and master and local wordlines for achieving a DRAM chip having low-power consumption, high-density and small size without affecting the chip's performance, including high random access speed and short cycle time.

24 Claims, 4 Drawing Sheets

HIERARCHICAL BITLINE DRAM ARCHITECTURE SYSTEM

FIELD OF THE INVENTION

This invention relates to the field of integrated circuit (IC) design. Specifically, it relates to a hierarchical bitline DRAM architecture system having a DRAM array which includes master and local bitlines for achieving a DRAM chip having low-power consumption, high-density and small size without affecting performance, including high random access speed and short cycle time.

BACKGROUND OF THE INVENTION

It is desirable for a memory chip to be operated at low-power. It is also desirable for the memory chip to have a high-density and a high "memory efficiency", or small size. However, it is further desirable for the memory chip to be capable of being operated at low-power, have a high-density and small size, but without affecting performance, including high random access speed and short cycle time.

Design engineers, in an effort to improve a memory chip's characteristics without affecting the chip's performance, generally experiment with altering the size and power consumption of the chip. For example, the fast cycle DRAM approach can achieve 6 to 8 ns cycle time by using relatively small array sizes. These small arrays achieve a fast cycle time, since the bitline and wordline loading is light. However, due to the small array size, e.g., 128 wordlines by 128 pairs of bitlines, the array efficiency is very poor; the array efficiency is the ratio of array area over memory chip area. Accordingly, such small arrays require more overhead, such as support circuits, including sense amplifiers and decoders. Hence, in order to improve array efficiency for the fast cycle small array design is quite a challenge.

Prior art memory chip designs to improve array efficiency have focused on using hierarchical wordline and bitline architecture. For example, a master wordline can be coupled to a plurality of local wordline sets and a master bitline can also be coupled to a plurality of local bitline sets. Therefore, each time, only one set of bitlines and/or one set of wordlines are activated. This design methodology provides a small activated array portion while maintaining reasonable array efficiency.

With reference to FIG. 1, there is shown a prior art hierarchical bitline architecture system where master bitlines 10a–d are coupled to corresponding local bitlines. For example, master bitline 10a is coupled to local bitlines 20a–d. The primary disadvantage of this prior art system is that the master bitline 10a must have the same pitch size as the local bitlines 20a–d, since the same number of master and local bitlines are needed. If the local bitlines 20a–d are formed using M1 (i.e., the first metal level) having a minimum pitch size and the master bitline 10a is formed by using M3, then the master bitline 10a cannot be printed with the same ground rule as the local bitlines 20a–d. Accordingly, the local bitlines 20a–d are forced to have some ground rule as that of the master bitline 20, thereby resulting in a larger array size.

Even if one relaxes the M1 pitch size of the local bitlines 20a–d to be exactly the same as the M3 pitch size of the master bitline 10a, there is no space left within the chip for M3 to be used for forming master data (or MDQ) lines, power lines, etc. This is because both M1 and M3 having a minimal pitch are used to form bitlines.

Another disadvantage of the prior art system shown by FIG. 1, is that for each pair of master bitlines 10a–d, a sense amplifier 30 is required. It is difficult for sense amplifiers to be laid out on the double pitch of bitlines given the fact that sense amplifiers are formed on the top and on the bottom of a DRAM array. More importantly, it is not desirable that each time a sub-array is accessed, all the sense amplifiers are activated even though only portion of the data from a sub-set of sense amplifiers is transferred out. This wastes power in conventional DRAM operation.

For example, if 2048 sense amplifiers are activated after one wordline is selected, only $\frac{1}{16}$ or 128 data bits are sent out. If the rest of the data bits are needed, then a page mode operation is carried out to subsequently read them all out in 15 additional cycles. Otherwise, all the data bits are just written back to the sub-arrays. Therefore, if only 128 data lines are available, the most power efficient way is just to provide 128 sense amplifiers, instead of 2048.

To achieve less number of sense amplifiers, or to share one sense amplifier with more bitlines, e.g., one sense amplifier for 16 bitline pairs, then a new system must be implemented. U.S. Pat. No. 5,394,371 issued on Feb. 28, 1995 describes a prior art system which allows for the massive sharing of sense amplifiers. U.S. Pat. No. 5,394,371 specifically teaches the concept of sharing sense amplifiers for a read only memory (ROM), such as mask ROM, where the data stored in the memory cells is non-volatile. That is, the data is not destroyed after a read operation. The data cannot be altered, except that for the mask ROM the data can be erased under UV exposure. This kind of memory is referred to as non-volatile random access memory (NVRAM).

The system described in U.S. Pat. No. 5,394,371 creates an equalization voltage using a dummy cell and then reads the data from all the cells coupled to the same wordline one-by-one sequentially. The system greatly reduces the number of sense amplifiers and eliminates power wasting by avoiding unnecessary sense amplifiers from swinging. However, the disclosed system cannot be used for DRAM, because data that is stored in a DRAM memory cell must be restored, or it could be destroyed.

In order to restore data, during a DRAM read period, there is a write-back period. The data signal that is developed and amplified in the bitlines must be stable before the data is written back to the DRAM cells.

In the system described in U.S. Pat. No. 5,394,371, the bitlines are floating after the decoder switches are shut off. At this moment, the data is not completely settled in the memory cells, since the wordline is still on. At the moment when the wordline is switching off from a boosted level (e.g., Vpp=2.5V) to ground or a negative level (e.g., Vneg=−0.5V), the strong swing of the wordline will couple all the floating bitlines lower, and it could jeopardize the "one" state signal in a DRAM cell. This coupling will do no harm to a NVRAM cell, since data is not required to be written back to the memory cells. Hence, the system described in U.S. Pat. No. 5,394,371 can only be used for NVRAMs.

SUMMARY

An aspect of the present invention is to provide a hierarchical bitline DRAM architecture system having a DRAM array which includes master and local bitlines for achieving a DRAM chip having low-power consumption, high-density and small size without affecting the chip's performance, including high random access speed and short cycle time.

Another aspect of the present invention is to provide a noise-free hierarchical bitline DRAM array which does not lose data during read/write operations.

Further, another aspect of the present invention is to provide a DRAM array having a folded-bitline differential sensing scheme and high array efficiency.

Further still, another aspect of the present invention is to provide a DRAM array having a minimum amount of sense amplifiers as compared to conventional DRAMs to save chip area and conserve power.

Further yet, another aspect of the present invention is to provide a DRAM array capable of storing data in both the single-cell and twin-cell array format, where the DRAM array is interchangeable between single-cell (for achieving high-density) and twin-cell (for consuming low-power) array operation.

Finally, another aspect of the present invention is to extend the hierarchical bitline DRAM architecture system to provide a hierarchical bitline and wordline DRAM architecture system having a DRAM array which includes master and local bitlines and master and local wordlines for achieving a DRAM chip having low-power consumption, high-density and small size without affecting the chip's performance, including high random access speed and short cycle time.

Accordingly, in an embodiment of the present invention, a hierarchical bitline DRAM architecture system is provided having a DRAM array which includes master and local bitlines for achieving a DRAM chip having low-power consumption, high-density and small size without affecting the chip's performance, including high random access speed and short cycle time. The DRAM array is designed to be noise-free and to prevent data from being lost during read/write operations. Further, the DRAM array includes a folded-bitline differential sensing scheme and high array efficiency. Further still, the DRAM array has a minimum amount of sense amplifiers as compared to conventional DRAMs to save chip area and conserve power.

Additionally, the DRAM array of the present invention is capable of storing data in both the single-cell and twin-cell array format. The DRAM array is interchangeable between single-cell and twin-cell array operation.

The hierarchical bitline DRAM architecture system of the present invention is extended to provide a hierarchical bitline and wordline DRAM architecture system having a DRAM array which includes master and local bitlines and master and local wordlines for achieving a DRAM chip having low-power consumption, high-density and small size without affecting the chip's performance, including high random access speed and short cycle time.

DETAILED DESCRIPTION OF THE INVENTION

The present invention provides a hierarchical bitline DRAM architecture system having a DRAM array which includes master and local bitlines for achieving a DRAM chip having low-power consumption, high-density and small size without affecting the chip's performance, including high random access speed and short cycle time. The DRAM array is designed to be noise-free and to prevent data from being lost during read/write operations. Further, the DRAM array includes a folded-bitline differential sensing scheme and high array efficiency. Further still, the DRAM array has a minimum amount of sense amplifiers as compared to conventional DRAMs to save chip area and conserve power.

Additionally, the DRAM array of the present invention is capable of storing data in both the single-cell and twin-cell array format. The DRAM array is interchangeable between single-cell and twin-cell array operation.

The hierarchical bitline DRAM architecture system of the present invention is extended to provide a hierarchical bitline and wordline DRAM architecture system having a DRAM array which includes master and local bitlines and master and local wordlines for achieving a DRAM chip having low-power consumption, high-density and small size without affecting the chip's performance, including high random access speed and short cycle time.

Figure 1:
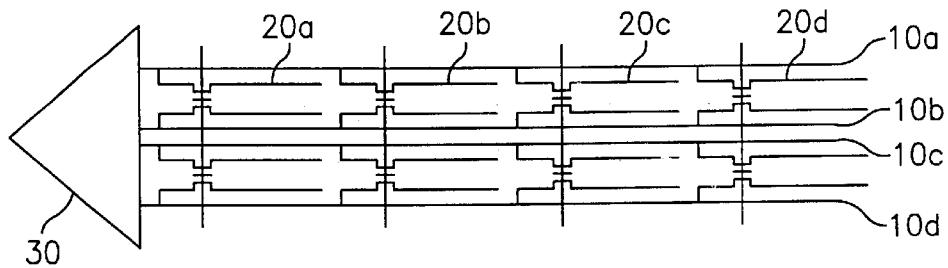
FIG. 1 is a prior art hierarchical bitline architecture system where master bitlines are coupled to corresponding local bitlines.
Figure 2:
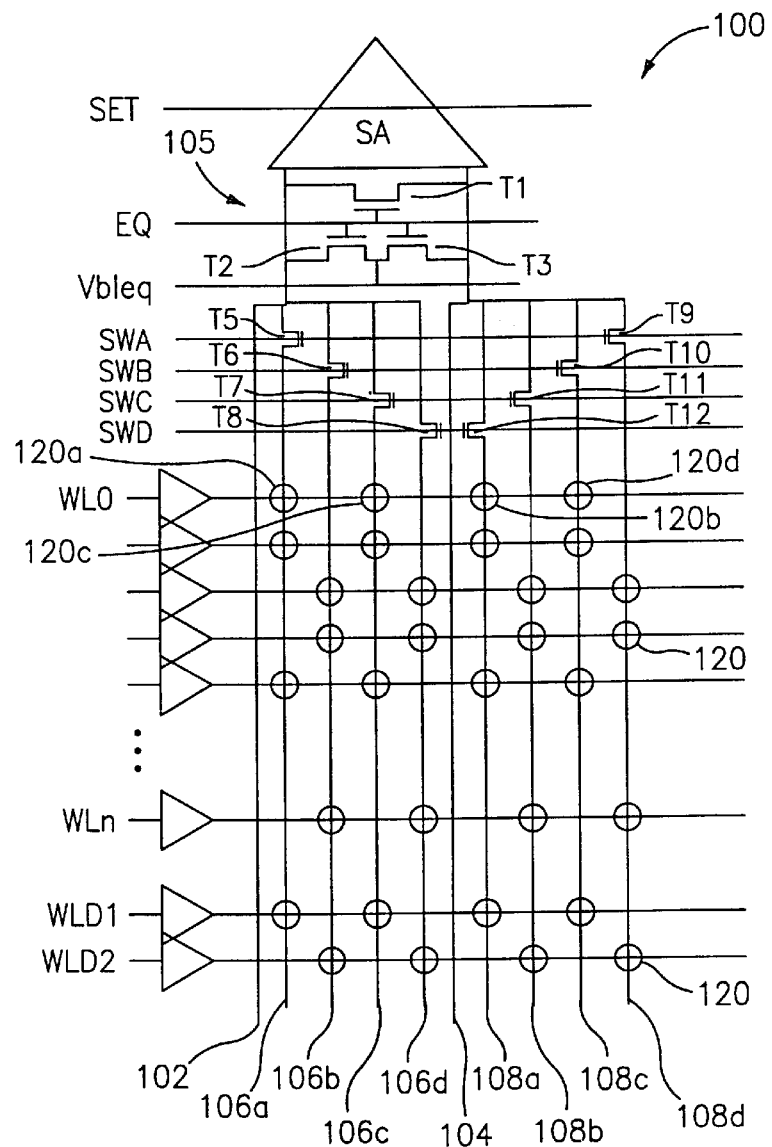
FIG. 2 is a schematic diagram of a preferred embodiment of a hierarchical bitline DRAM architecture system according to the present invention.

With reference to FIG. 2, there is shown a schematic diagram of a preferred embodiment of a hierarchical bitline DRAM architecture system having a DRAM array according to the present invention. Only a portion of the DRAM architecture system is shown by FIG. 2. However, one skilled in the art can appreciate that the system includes a plurality of sense amplifiers, a plurality of memory cells, and other components.

In FIG. 2, the DRAM array is designated generally by reference numeral 100. The 159 two vertical thick lines 102, 104 are the pair master bitlines formed in M3. For example, one of the two vertical thick lines is the true master bitline and the other one is the complementary master bitline. Each true and complimentary master bitline is coupled to four respective local bitlines 106a–d, 108a–d via switches T5 to T8 and T9 to T12, respectively. The local bitlines 106a–d, 108a–d are formed in M1. Two groups of switches are staggered symmetrically.

Each array cell 120 of the DRAM array 100 is preferably formed in $8F^2$ pattern with the folded-bitline structure. The pair of master bitlines 102, 104 are inputted to a sense amplifier SA, and connected to an equalization circuit 105 formed by switches T1, T2, T3.

The equalization circuit 105 is capable of receiving an equalization signal EQ for turning on 25 switches T1, T2, T3 in order to equalize all the bitlines in the DRAM array 100. The equalization circuit 105 is also capable of receiving a voltage Vbleq. The DRAM array 100 includes a plurality of wordlines from WL0 to WLn. In addition, there are two dummy wordlines, WLD1 and WLD2.

Figure 3A:
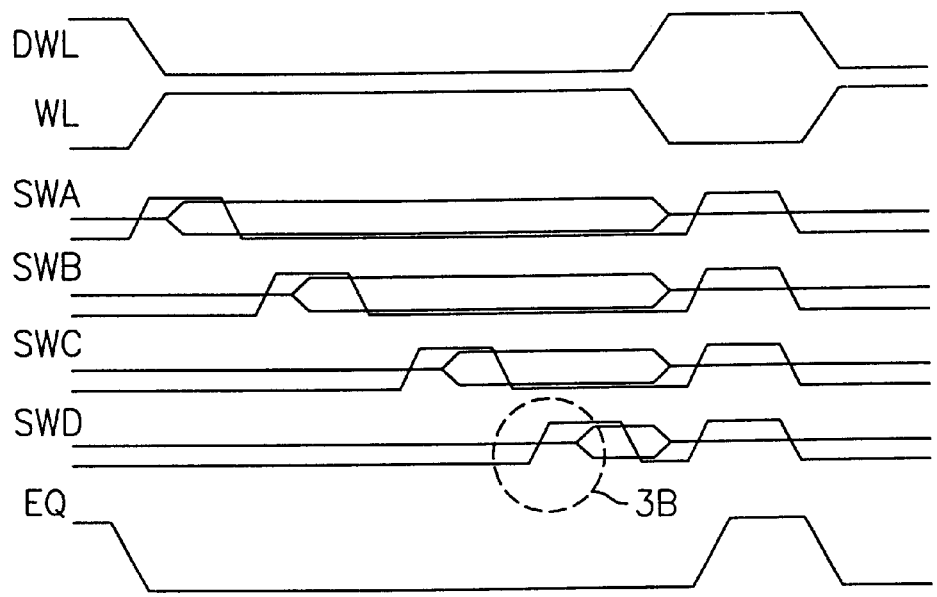
FIG. 3A are waveform diagrams of a read operation using the hierarchical bitline DRAM architecture system of FIG. 2.

To better understand the operation of the hierarchical bitline DRAM architecture system of the present disclosure, a read operation procedure will now be described with reference to the waveform diagrams shown by FIG. 3A. First, one wordline WL, e.g., WL0, is activated from low to high. In order to cancel the coupling noise, one of the dummy wordlines WLD1, WLD2 (according to which wordline is activated) is deactivated from high to low. This is shown in FIG. 3A, by the waveform diagram corresponding to DWL.

Assuming the memory cell reading order is from left to right and the activated wordline is WL0. When switch SWA is turned on (depicted by the third waveform diagram in FIG. 3A), it connects the first and the eighth local bitlines 106a, 108d to the master bitlines 102, 104 and then to the sense amplifier SA. Since the first bitline 106a connects to a memory cell 120a, it serves as the active bitline while the eighth bitline 108d serves as the reference bitline.

The signal stored in the memory cell 120a will be developed on the pair of bitlines 106a, 108d by a charge sharing effect. The signal is then amplified when a high SET signal is received by the sense amplifier SA (see FIG. 3B). Once the data is fully amplified, it is transferred to the data line (not shown) and switch SWA is turned off. Immediately, switch SWB is turned on (depicted by the fourth waveform diagram in FIG. 3A). Similarly as described above, now the seventh bitline 108c is the active bitline, while the second bitline 106b is the reference bitline. After the second signal is read to the data line, switch SWB is turned off and switch SWC is turned on (depicted by the fifth waveform diagram in FIG. 3A). The read operation continues until the last switch SWD is turned off (depicted by the sixth waveform diagram in FIG. 3A) when the last data is read.

At this moment, all the bitlines 106a–d, 108a–d are floating and are very sensitive to the coupling noise. The activated wordline is then switched off and simultaneously one of the dummy wordlines WLD1, WLD2 (according to which wordline was activated) is activated to completely cancel the wordline-to-bitline coupling noise. The wordline-to-bitline coupling noise is canceled due to the simultaneous up and down coupling of the active wordline and one dummy wordline during switching. The switches T1, T2, T3 of the equalization circuit 105 are then switched on by transmitting a high equalization signal EQ to the DRAM array 100 (depicted by the seventh waveform diagram in FIG. 3A). Hence, all the bitlines 102, 104, 106a–d, 108a–d are equalized. Since the voltage levels of all bitline pairs are either at Vdd or ground, the equalization operation is very efficient.

Figure 3B:
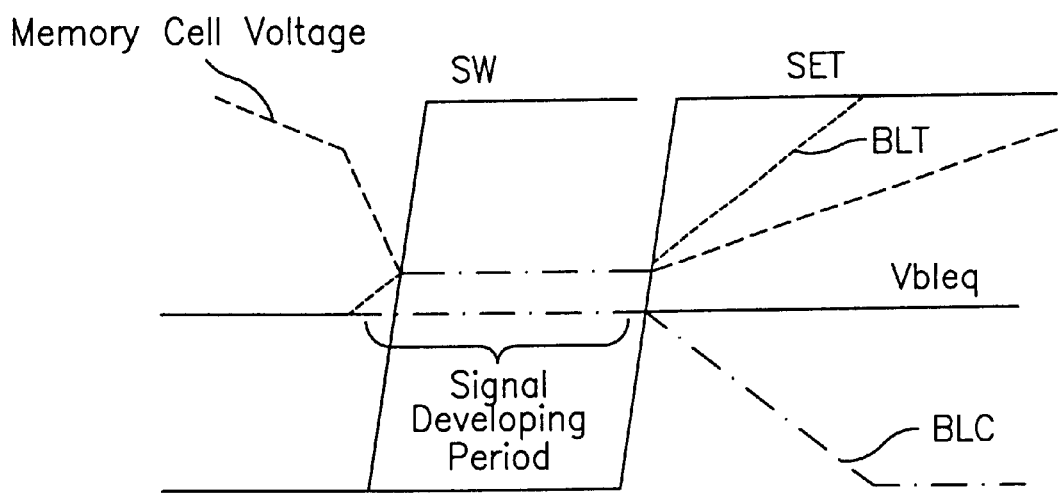
FIG. 3B is an enlarged portion of a waveform diagram depicted by FIG. 3A.

With reference to FIG. 3B, there is shown an enlarged portion of a waveform diagram depicted by FIG. 3A. FIG. 3B illustrates the voltage variation at each cell node and bitline pair. FIG. 3B further illustrates the timing of the switch SW (which represents anyone of the switches SWA, SWB, SWC, SWD) and SET signals. Assuming that the memory cell is originally stored with a "high" state, after the wordline and the switch are turned on, the charge sharing effect causes the true bitline voltage level BLT to flow up to a level above the equalization voltage level Vbleq. The difference between the true bitline voltage level BLT or and the equalization voltage level Vbleq is in the range of 90 to 130 mV. This is referred to as the sensing signal which depends on bitline capacitance, wordline boost voltage level, and duration of the signal development period.

When the set signal SET of the sense amplifier SA is activated to a high voltage level, differential sensing via the cross-couple sense amplifier SA separates the true bitline voltage level BLT and the complementary bitline voltage level BLC from ground to Vdd. However, the memory cell voltage level as shown by FIG. 3B takes a longer time to reach a high voltage level as compared to the true bitline voltage level BLT, even when the wordline is fully activated and the corresponding switch is turned on. This is because the switch's or transfer device's series resistance is high.

Even after the corresponding switch is turned off, the internal node voltage of the memory cell can still climb to the same voltage level as that of the true bitline voltage level BLT assuming that bitline capacitance is higher than the memory cell node capacitance. The advantage is that the data can be sequentially read out from the memory cells at a high speed. The disadvantage is however that the bitlines are at a floating state which makes them susceptible to coupling noise. Accordingly, a coupling noise problem is presented.

Figure 4:
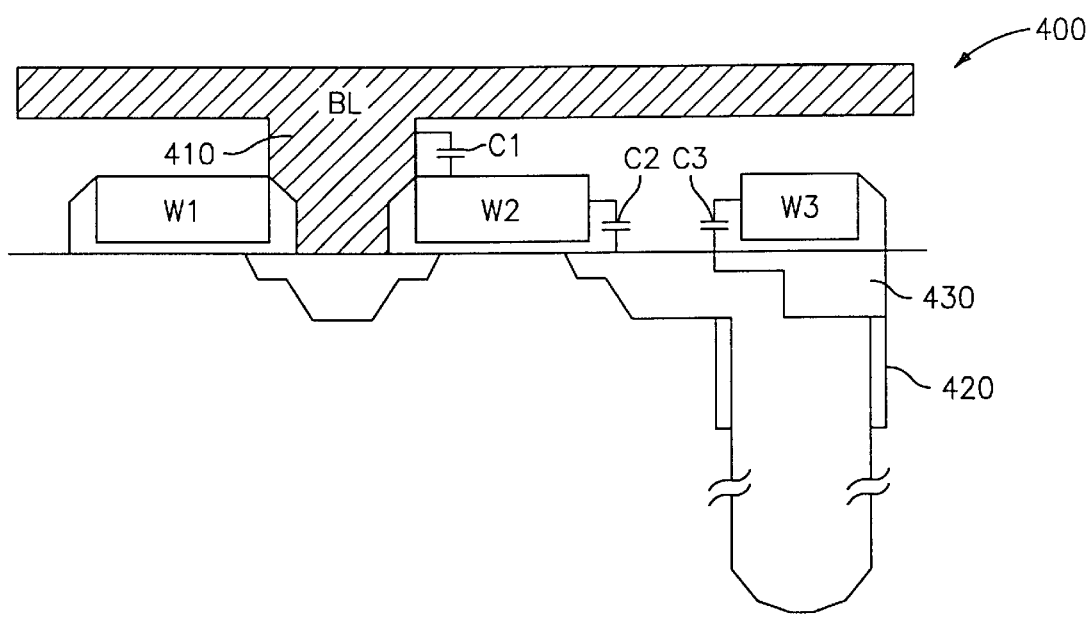
FIG. 4 is cross-sectional schematic view of a prior art trench DRAM memory cell.

To solve the coupling noise problem, two dummy wordlines WLD1, WLD2 are provided in the DRAM array 100 as mentioned above and further described below. With reference to FIG. 4, there is shown a cross-sectional schematic view of a prior art trench DRAM memory cell designated generally by reference numeral 400. Two wordlines W1, W2 share a common source contact 410 which is linked to a bitline BL. A third wordline W3 which is referred to as a passing wordline is situated on top of a deep trench capacitor 420.

The coupling capacitance between the active wordline-to-bitline is represented by C1; the coupling capacitance between the active wordline-to-cell node is represented by C2; the coupling capacitance between the passing wordline-to-cell node is represented by C3. C2 is the most dangerous or critical coupling capacitance to the operation of the memory cell. This coupling capacitance can directly effect the memory cell voltage, thereby destroying the data.

The passing wordline W3 has the least effect on the cell node, since it is situated on top of a thicker oxide layer 430, as compared to the oxide layers below the other two wordlines W1, W2. In other words, the active wordline and the passing wordline W3 couple the cell node in different degrees. This is the reason why two dummy wordlines WLD1, WLD2 are needed for the DRAM array 100.

The first dummy wordline WLD1 is used to cancel the coupling noise from activating wordlines WL0, WL1, WL4, WL5, WL8, WL9, . . . , while the second dummy wordline WLD2 is used to cancel the coupling noise from activating wordlines WL2, WL3, WL6, WL7, WL10, WL11, . . . Without the dummy wordlines WLD1, WLD2, due to the asymmetrical coupling capacitance within the DRAM array 100, the coupling noise would not be fully canceled out. Accordingly, the integrity of the data stored within the DRAM array 100 would be affected.

The hierarchical bitline DRAM architecture system of the present invention is capable of being operational in the single-cell and twin-cell array formats. In order to write/read data to and from the DRAM array 100 in the twin-cell array format, two switches must be simultaneously turned on. For example, if switches SWA, SWD are simultaneously turned on during a write operation, true and complimentary data is written in the first and third memory cells, i.e., memory cells 120a and 120b. If switches SWB, SWC are simultaneously turned on, true and complementary data is written in the second and fourth memory cells, i.e., memory cells 120c and 120d. For a read operation in the twin-cell array format, the same procedure is followed. If only one switch is turned on, then the DRAM array 100 is operated in the single-cell array format as described above.

The single-cell array format increases the density of the DRAM array 100, while the twin-cell array format conserves power. Hence, the DRAM array 100 is preferably operated in the single-cell array format during an active mode and operated in the twin-cell array format during a sleep mode. Accordingly, prior to entering the sleep mode, the data stored within the DRAM array 100 is converted to the twin-cell array format. Then, prior to entering the active mode, the data stored within the DRAM array 100 is converted to the single-cell array format.

The conversion methods from the single-cell array format to the twin-cell array format and from the twin-cell array format to the single-cell array format are described in copending, commonly assigned U.S. patent application filed on Feb. 15, 2001 by Hsu et al. having U.S. application Ser. No. 09/783,918; the contents of which are incorporated herein by reference.

During the twin-cell array format, since the true and complementary data are stored within the DRAM array 100, the signal margin is doubled as compared to the single-cell array format. Hence, during the twin-cell array format, the refresh period can be increased to conserve refresh power.

It is provided that the hierarchical bitline DRAM architecture system described above can be extended to incorporate a hierarchical wordline DRAM architecture system to produce a hierarchical bitline and wordline DRAM architecture system having a plurality of small sub-arrays or micro arrays. Each micro array has a high cell efficiency.

Figure 5:
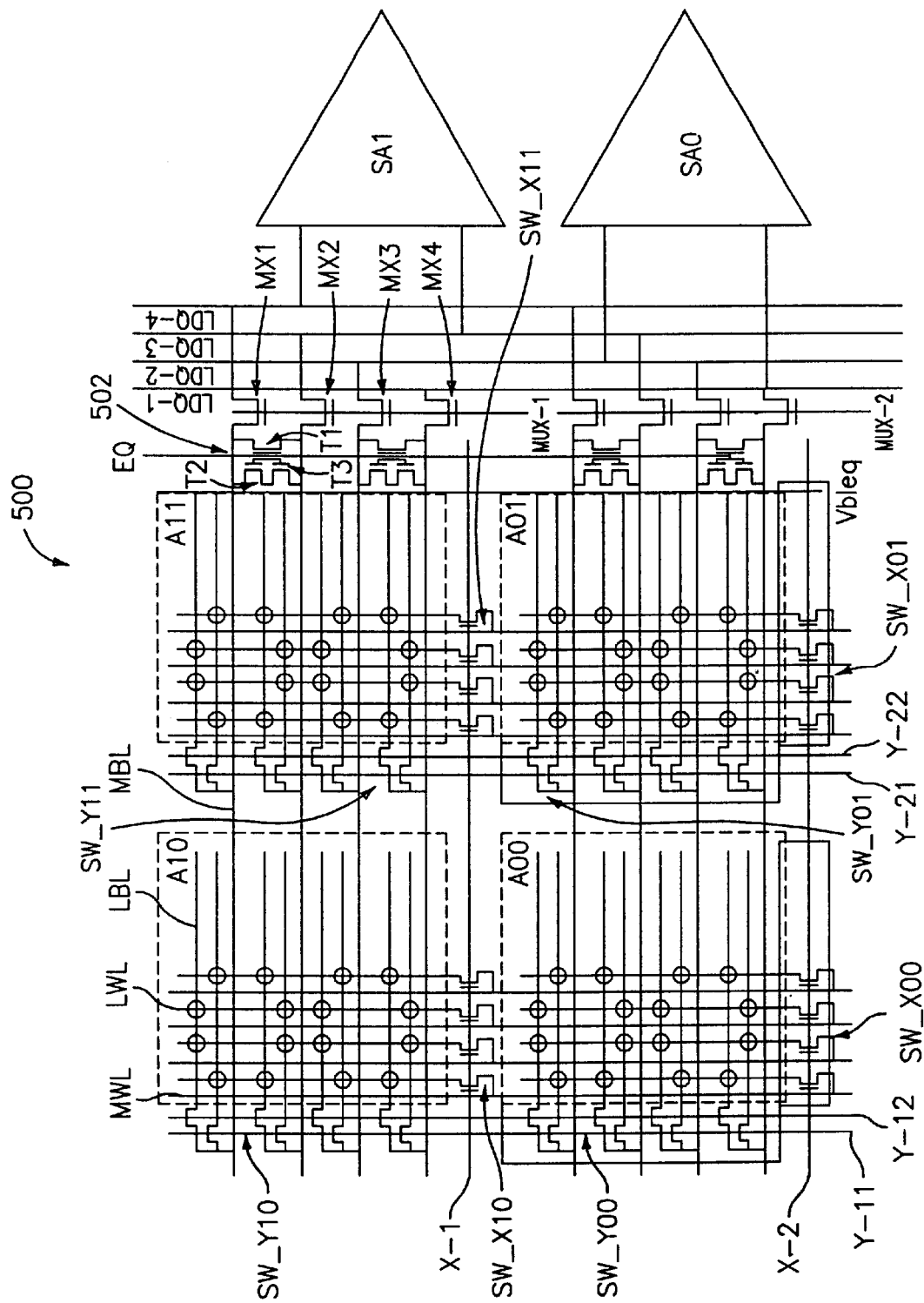
FIG. 5 is a schematic diagram of a preferred embodiment of a hierarchical bitline and wordline DRAM architecture system according to the present invention.

With reference to FIG. 5, there is shown a schematic diagram of a preferred embodiment of a hierarchical bitline and wordline DRAM architecture system according to the present invention. In FIG. 5, for simplicity purposes, only four micro arrays A00, A01, A10, A1 are shown for DRAM array 500. The vertical thick lines are master wordlines MWLs formed in M2, and the vertical thin lines are local wordlines LWLs preferably formed by CVD polysilicon. The horizontal thick lines are master bitlines MBLs formed in M3, and the horizontal thin lines are local bitlines LBLs formed in M1.

In the exemplary DRAM array 500, each master bitline MBL is connected to one of two sense amplifiers SA0, SA1 and one of four local data lines LDQ-1–4 via switches MX1–4. Groups of switches MX1–4 are connected to multiplexer switch lines MUX-1, MUX-2. Each master bitline MBL is also connected to an equalization circuit 502 which is similar in structure and operation to the equalization circuit 105 described above with reference to FIG. 2. The equalization circuit 502 is capable of receiving an equalization signal EQ for turning on switches T1, T2, T3 in order to equalize all the bitlines in the DRAM array 500. The equalization circuit 502 is also capable of receiving a voltage Vbleq, similarly to the equalization circuit 105 described above.

In the DRAM array 500, each master bitline MBL couples to two local bitlines LBLs. It is provided that the DRAM array 500 can be designed such that each master bitline MBL couples to any number of local bitlines LBLs. For video RAMs intended for graphic applications, a higher number of local bitlines LBLs should be coupled to each master bitline MBL for optimum performance.

The master wordline line switches X-1 and X-2 are used to activate either the upper or lower micro arrays by switching the switch components for the master wordlines MWLs. These switch components are groups of nMOS or pMOS devices, i.e., SW_X00, SW_X01, SW_X10, SW_X11. The master bitline line switches Y-11 and Y-12 are used to activate the left two micro arrays, and master bitline line switches Y-21 and Y-22 are used to activate the right two micro arrays by switching the switch components for the master bitlines MBLs. These switch components are groups of nMOS or pMOS devices, i.e., SW_Y00, SW_Y01, SW_Y10, SW_Y11.

For example, if data that is stored within micro array A11 needs to be read, the master wordline line switch X-1 is activated during row decoding of the two upper micro arrays A11, A10. The data is then transferred to the local bitlines LBLs within these two micro arrays. Then, by activating MUX-1, the top switches MX1-4 are turned on and the master bitlines MBLs of the upper micro arrays A10, A11 are connected to the sense amplifiers SA0, SA1. By turning on master bitline line switch Y-21, data from the even local bitlines LBLs is read via a corresponding master bitline MBL; then by turning on master bitline line switch Y-22, data from the odd local bitlines LBLs is read via a corresponding master bitline MBL. For twin-cell array operation, both master bitline switches Y-21, Y-22 are simultaneously turned on. The data stored within the other mirco arrays A00, A01, A10 can be read in a similar manner.

In short, data is read from the DRAM array 500 by activating one of the micro arrays A00, A01, A10, A11; activating a first local wordline of the activated micro array via a master wordline MWL traversing the activated micro array; transferring data stored within a first group of memory cells of the selected micro array which are coupled to the first local wordline LWL to local bitlines LBLs; connecting at least one master bitline MBL traversing the activated micro array to a corresponding sense amplifier; sequentially transferring data from each of the local bitlines LBLs via the at least one master bitline MBL traversing the activated micro array to the corresponding sense amplifier; and reading the data from the corresponding sense amplifier.

Further, data can be written to any of the micro arrays A00, A01, A10, A11 in a similar manner. For example, data is transferred to the DRAM array 500 via the LDQ lines. Depending on the MUX-1 and MUX-2 switches, the data is transferred to either micro arrays A10, A11 or micro arrays A00, A01. Then, depending on switches Y-11, Y-12 or Y-21, Y22, the data is transferred to the bitlines of one of the selected micro arrays. By activating a master wordline MWL and local wordlines LWLs, the data is then stored in the appropriate row of the selected micro array.

In short, data is written to the DRAM array 500 by activating one of the micro arrays A00, A01, A10, A11; activating local bitlines LBLs of the activated micro array via master bitlines MBLs traversing the activated micro array; transferring data to the activated local bitlines LBLs via the local datalines LDQs of the DRAM array 500; sequentially activating a master wordline MWL traversing the activated micro array; and sequentially activating a local wordline LWL corresponding to the activated master wordline MWL of the activated micro array to transfer data from the activated local bitlines LBLs to memory cells of the activated micro array.

The two dummy wordlines which were described above with reference to FIG. 2 are not shown by FIG. 5. It is provided that dummy wordlines are also incorporated within the DRAM array 500, and are used in a similar manner as the dummy wordlines WLD1, WLD2 of DRAM array 100, i.e., to cancel the coupling noise. The dummy wordlines are incorporated in a horizontal manner within each of the micro arrays A00, A01, A10, A11. For example, two dummy wordlines reside in micro array A00 which are used to cancel coupling noise during operation of micro array A00, and so on.

It is contemplated that by relaxing the pitch of the master bitlines MBLs, master datalines (or MDQs) can be inserted in between the master bitlines MBLs. These inserted datalines and bitlines can be used as a noise shield during data sensing. Further, while transferring data, the master wordlines MWLs can act as a noise shield for the datalines. Since the datalines and bitlines are not activated at the same time, one can shield the coupling noise created during operation of the other.

In conclusion, although, many shared sense amplifier schemes have been proposed, the hierarchical bitline DRAM architecture system and hierarchical bitline and wordline DRAM architecture system of the present invention can yield the highest cell efficiency, while having a small array size and high performance. The DRAM architecture systems of the present invention are the first such systems to be disclosed for DRAM applications.

The systems of the present invention provide several new features: (1) full noise cancellation using two dummy wordlines per DRAM array to ensure data integrity; (2) effective multi-bitline equalization to equalize all the bitlines at once; (3) data can be stored in the single-cell or twin-cell array format to achieve high density in the active mode, and to conserve power in the sleep mode; and (4) the number of sense amplifiers is greatly reduced to decrease the size of the chip and to conserve power. The hierarchical bitline and wordline DRAM architecture system also includes micro arrays for providing high performance and a good cell efficiency.

What has been described herein is merely illustrative of the application of the principles of the present invention. For example, the systems described above and implemented as the best mode for operating the present invention are for illustration purposes only. As a particular example, for instance, other design configurations may be used for the hierarchical bitline DRAM architecture system which provide similar operation as the system described above. In other words, other arrangements and methods may be implemented by those skilled in the art without departing from the scope and spirit of this invention.

We claim:

1. A hierarchical DRAM array system comprising:
  a plurality of memory cells arranged in a data array;
  a plurality of master bitlines traversing the data array;
  a plurality of local bitline groups, wherein a local bitline group of the plurality of local bitline groups is connected to a corresponding master bitline of the plurality of master bitlines during a data transfer operation; and
  a plurality of sense amplifiers, wherein one sense amplifier is selectively connected to at least two pairs of master bitlines for sensing signals propagated along a selected pair of the at least two pairs of master bitlines.

2. The DRAM array system according to claim 1, wherein each of the plurality of local bitline groups has at least two local bitlines.

3. The DRAM array system according to claim 1, further comprising at least one equalization circuit having switches and an input line for receiving an equalization signal for controlling the switches, the at least one equalization circuit coupled to a pair of master bitlines of the plurality of master bitlines for equalizing the pair of master bitlines and a corresponding local bitline group of the plurality of local bitline groups upon receiving the equalization signal.

4. The DRAM array system according to claim 1, further comprising a set of switches for each local bitline group of the plurality of local bitline groups, wherein each switch of the set of switches controls the activation of a respective local bitline.

5. The DRAM array system according to claim 4, wherein each set of switches controls the interchanging of a group of memory cells of the plurality of memory cells between single-cell and twin-cell array operation.

6. The DRAM array system according to claim 5, wherein in the single-cell array operation data is stored in a single-cell array format and in the twin-cell array operation data is stored in a twin-cell array format.

7. The DRAM array system according to claim 4, wherein the set of switches is configured such that when one switch is switched on, the other switches are switched off, unless a logic high equalization signal is received by the DRAM array system.

8. The DRAM array system according to claim 1, further comprising a plurality of wordlines traversing the data array.

9. The DRAM array system according to claim 1, further comprising:
  a plurality of master wordlines traversing the data array; and
  a plurality of local wordline groups, wherein each local wordline group of the plurality of local wordline groups is connected to a corresponding master wordline of the plurality of master wordlines.

10. The DRAM array system according to claim 1, wherein the data array includes a plurality of micro arrays, each of the plurality of micro arrays includes a local bitline group of the plurality of local bitline groups and a local wordline group of a plurality of local wordline groups.

11. The DRAM array system according to claim 10, wherein at least one of the plurality of master bitlines traverses each of the plurality of micro arrays and at least one of a plurality of master wordlines traverses each of the plurality of micro arrays, the at least one of the plurality of master bitlines is coupled to the local bitline group and the at least one of the plurality of master wordlines is coupled to the local wordline group.

12. The DRAM array system according to claim 10, wherein the local bitline group is coupled to a series of switches for activating local bitlines of the local bitline group and the local wordline group is coupled to a series of switches for activating local wordlines of the local wordline group.

13. The DRAM array system according to claim 1, further comprising a multiplexer line switch connected to a respective master bitline of the plurality of master bitlines traversing the data array.

14. The DRAM array system according to claim 1, further comprising at least two dummy wordlines traversing the data array for canceling coupling noise upon the activation of at least one of a plurality of wordlines traversing the data array.

15. The DRAM array system according to claim 14, wherein the at least two dummy wordlines have a similar structure as a plurality of non-dummy wordlines traversing the data array.

16. A hierarchical DRAM array system comprising:
  a plurality of memory cells arranged in a data array;
  a hierarchical bitline structure comprising:
    a plurality of master bitlines traversing the data array;
    a plurality of local bitline groups, wherein a local bitline group of the plurality of local bitline groups is connected to a corresponding master bitline of the plurality of master bitlines during a data transfer operation; and
    a plurality of sense amplifiers, wherein one sense amplifier is selectively connected to at least two pairs of master bitlines for sensing signals propagated along a selected pair of the at least two pairs of master bitlines; and
  a hierarchical wordline structure comprising:

a plurality of master wordlines traversing the data array; and a plurality of local wordline groups, wherein each local wordline group of the plurality of local wordline groups is connected to a corresponding master wordline of the plurality of master wordlines during the data transfer operation.

17. The DRAM array system according to claim 16, wherein the data array includes a plurality of micro arrays, each of the plurality of micro arrays includes a local bitline group of the plurality of local bitline groups and a local wordline group of a plurality of local wordline groups.

18. The DRAM array system according to claim 17, wherein the local bitline group is coupled to a series of switches for activating local bitlines of the local bitline group and the local wordline group is coupled to a series of switches for activating local wordlines of the local wordline group.

19. The DRAM array system according to claim 16, further comprising at least one equalization circuit having switches and an input line for receiving an equalization signal for controlling the switches, the at least one equalization circuit coupled to a pair of master bitlines of the plurality of master bitlines for equalizing the pair of master bitlines and a corresponding local bitline group of the plurality of local bitline groups upon receiving the equalization signal.

20. The DRAM array system according to claim 16, further comprising a multiplexer line switch connected to a respective master bitline of the plurality of master bitlines traversing the data array.

21. The DRAM array system according to claim 16, further comprising means for interchanging at least one of the plurality of memory cells between single-cell and twin-cell array operation, wherein in the single-cell array operation one data is stored in one memory cell in the data array and in the twin-cell array operation one data is stored in two memory cells in the data array.

22. A method for executing a write operation in a hierarchical DRAM memory system having a plurality of memory cells arranged in a plurality of arrays, the method comprising the steps of:

activating at least one array of the plurality of arrays;

transferring data to master bitlines of the at least one activated array via datalines of the DRAM memory system;

selecting an array of the at least one activated array by activating local bitlines traversing the selected array;

sequentially transferring the data from the master bitlines traversing the at least one activated array to at least first and second local bitlines connected to the master bitlines traversing the at least one activated array;

activating a master wordline traversing the activated array; and activating a local wordline corresponding to the activated master wordline of the activated array to transfer data from the activated local bitlines to memory cells of the activated array.

23. A method for executing a read operation in a hierarchical DRAM memory system having a plurality of memory cells arranged in a plurality of arrays, the method comprising the steps of:

selectively connecting more than one pair of master bitlines traversing the plurality of arrays to one sense amplifier of a plurality of sense amplifiers;

activating a master wordline traversing at least one array of the plurality of arrays;

activating local wordlines traversing at least one array of the plurality of arrays, wherein an array traversed by an activated master wordline and activated local wordlines is an activated array;

sequentially connecting first and second groups of local bitlines to associated master bitlines traversing the activated array for sequentially transferring first and second sets of data signals from respective first and second groups of memory cells traversed by the activated local wordlines to the connected master bitlines;

selecting the master bitlines traversing the activated array for connecting the selected master bitlines to the one sense amplifier; and sequentially providing the first and second set of data signals to the one sense amplifier via the selected master bitlines.

24. A method for executing a write operation in a hierarchical DRAM memory system having a plurality of memory cells arranged in a plurality of arrays, the DRAM memory system receiving data via a plurality of datalines, the method comprising the steps of:

connecting master bitlines traversing at least one array of the plurality of arrays to corresponding datalines of the plurality of datalines;

transferring data from the corresponding datalines to the connected master bitlines;

activating a master wordline traversing at least one array of the plurality of arrays, wherein an array of the plurality of arrays traversed by the activated master wordline and the connected master bitlines is an activated array; and activating at least one local wordline associated with the activated master wordline;

sequentially connecting at least first and second groups of local bitlines traversing the activated array to associated connected master bitlines;

sequentially transferring the data from the connected master bitlines to the connected at least first and second groups of local bitlines; and transferring data from the at least first and second groups of local bitlines to the at least one activated local wordline for writing the transferred data into memory cells traversed by the at least one activated local wordline.

* * * * *